United States Patent
Gonano et al.

(10) Patent No.: US 8,659,351 B2
(45) Date of Patent: Feb. 25, 2014

(54) ELECTRONIC CIRCUIT FOR DRIVING A SWITCHING AMPLIFIER

(75) Inventors: Giovanni Gonano, Padua (IT); Edoardo Botti, Vigevano (IT); Flavio Polloni, Cuggiono (IT); Pietro Mario Adduci, Settimo Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 362 days.

(21) Appl. No.: 13/168,667

(22) Filed: Jun. 24, 2011

(65) Prior Publication Data
US 2012/0045076 A1 Feb. 23, 2012

(30) Foreign Application Priority Data
Jun. 25, 2010 (IT) .............................. MI2010A1163

(51) Int. Cl.
H03F 3/38 (2006.01)
(52) U.S. Cl.
USPC .......................... 330/10; 330/251; 330/207 A
(58) Field of Classification Search
USPC ....................................... 330/10, 251, 207 A
See application file for complete search history.

(56) References Cited

U.S. PATENT DOCUMENTS

| | | | |
|---|---|---|---|
| 6,181,199 B1 * | 1/2001 | Camp et al. | 330/10 |
| 6,489,840 B2 | 12/2002 | Botti et al. | |
| 6,538,504 B1 * | 3/2003 | Kirn | 330/10 |
| 7,498,881 B2 * | 3/2009 | Wang | 330/251 |
| 7,872,522 B2 * | 1/2011 | Menard et al. | 330/10 |
| 7,920,023 B2 * | 4/2011 | Witchard | 330/10 |
| 7,940,141 B2 * | 5/2011 | Stapelbroek | 332/107 |
| 8,355,465 B2 * | 1/2013 | Wojtiuk | 375/308 |
| 2005/0083115 A1 | 4/2005 | Risbo | |
| 2006/0262843 A1 | 11/2006 | Kim et al. | |
| 2008/0030270 A1 | 2/2008 | Strydom et al. | |
| 2009/0231035 A1 | 9/2009 | Tseng et al. | |
| 2009/0289704 A1 | 11/2009 | Forte | |
| 2010/0102883 A1 | 4/2010 | Stapelbroek | |

* cited by examiner

*Primary Examiner* — Patricia Nguyen
(74) *Attorney, Agent, or Firm* — Seed IP Law Group PLLC

(57) ABSTRACT

An electronic circuit is disclosed for driving a switching amplifier. The electronic circuit is configured for generating, when operating in a switch-on mode, a driving signal for driving the switching amplifier. The driving signal carries a plurality of pulses having: an pulse width increasing between contiguous pulses of the plurality of pulses according to a step value having modulus equal to two and odd values; a polarity alternating between the contiguous pulses.

22 Claims, 6 Drawing Sheets

ELECTRONIC CIRCUIT FOR DRIVING A SWITCHING AMPLIFIER

BACKGROUND

1. Technical Field

The present disclosure generally relates to the field of power amplifiers. More particularly, the present disclosure relates to an electronic circuit for driving a switching power amplifier for a diffuser of an audio signal.

2. Description of the Related Art

It is known that an audio amplification system comprises an audio signal source (for example, a Compact Disk wherein the audio signal is of the Pulse Code Modulation—PCM-type), an audio amplifier, a low-pass filter for eliminating frequencies higher than the audio band and an audio signal diffuser (for example, a speaker, headphones or earphones.)

More particularly, the audio amplifier comprises a Pulse Width Modulator—PWM-, comprises a driving circuit of a switching amplifier and comprises the switching amplifier.

It is known that proper precautions should be taken in order to avoid (or reduce) abrupt transitions at the ends of the diffuser of the audio signal when switching on the switching amplifier (i.e., when the switching amplifier is powered-up) and when switching off (i.e., when the switching amplifier is powered-down), since abrupt transitions cause the generation of audible noise when switching on and off the switching amplifier; said noise is commonly referred to as "pop" noise (or also "click" noise).

A prior art for reducing the generation of the pop noise is disclosed in the US patent application No. 2008/0030270, wherein (see for example FIG. 4a and par. 22) the voltage (in case the switching amplifier is switched on) at the ends of the speaker is step-wise increased in a switch-on transient phase comprised between the instant when the switching amplifier is switched on and a steady instant wherein the switching amplifier is normally operating. The Applicant has observed that a drawback of this prior art is that it is too complex since it requires an accurate control of the time instants (see formulae in par. 24); moreover this prior art is not always efficient in reducing the pop noise.

Another prior art for reducing the pop noise generation is disclosed in the US Patent Application No. 2006/0262843, wherein in the transient phase (for example, when switching on) the pulse width modulator generates a pair of pulse signals with width gradually increasing linearly or exponentially (see for example FIGS. 5A and 5B). The Applicant has observed that a drawback of this prior art is that it is not efficient in the reduction of the pop noise.

A further prior art for reducing the pop noise generation is disclosed in the US patent application No. 2005/0083115, wherein (see for example FIG. 6D) the voltage differential signal in output from the full bridge switching amplifier is a square wave with a pulses width gradually increasing starting from value zero and with amplitude of subsequent pulses alternating between the positive value and the negative value. The Applicant has noticed that a drawback of this prior art is that it is too complex.

A further prior art for reducing the pop noise generation is disclosed in the U.S. Pat. No. 6,489,840, wherein (at the switch-on) a square wave periodic signal is generated in output from the amplifier with a pulse whose width is a fraction of the period, preferably ¼ of the period. The Applicant has noticed that a drawback of this prior art it that it is capable of reducing the pop noise only by a predetermined amount.

BRIEF SUMMARY

The present disclosure relates to an electronic circuit for driving a switching amplifier as defined in the enclosed claim 1 and preferred embodiments thereof disclosed in the dependent claims 2 to 6.

The Applicant has perceived that the circuit according to one embodiment the present disclosure has the following advantages:
- it may sensibly reduce the pop noise generation during the switch-on (or switch-off) of the switching amplifier;
- it is possible to change the amount of the reduction of the pop noise;
- the implementation is simple and cheap;
- the length of the switch-on (or switch-off) operation mode is reduced;
- it does not require any feedback control;
- it does not depend on the type of low-pass filter;
- it is independent, to a large extent, from the value of the modulation frequency.

One embodiment of the present disclosure is a system as defined in the enclosed claim 7 and preferred embodiments thereof are disclosed in the dependent claims 8 to 10.

One embodiment of the present disclosure is an integrated circuit as defined in the enclosed claim 11.

One embodiment of the present disclosure is a method for driving a switching amplifier, as defined in the enclosed claims 12 and 13.

BRIEF DESCRIPTION OF THE SEVERAL VIEWS OF THE DRAWINGS

Further characteristics and the advantages of the disclosure will result from the following description of a preferred embodiment and variants thereof provided only as a way of example, with reference to the enclosed drawings, wherein.

DETAILED DESCRIPTION

Figure 1:
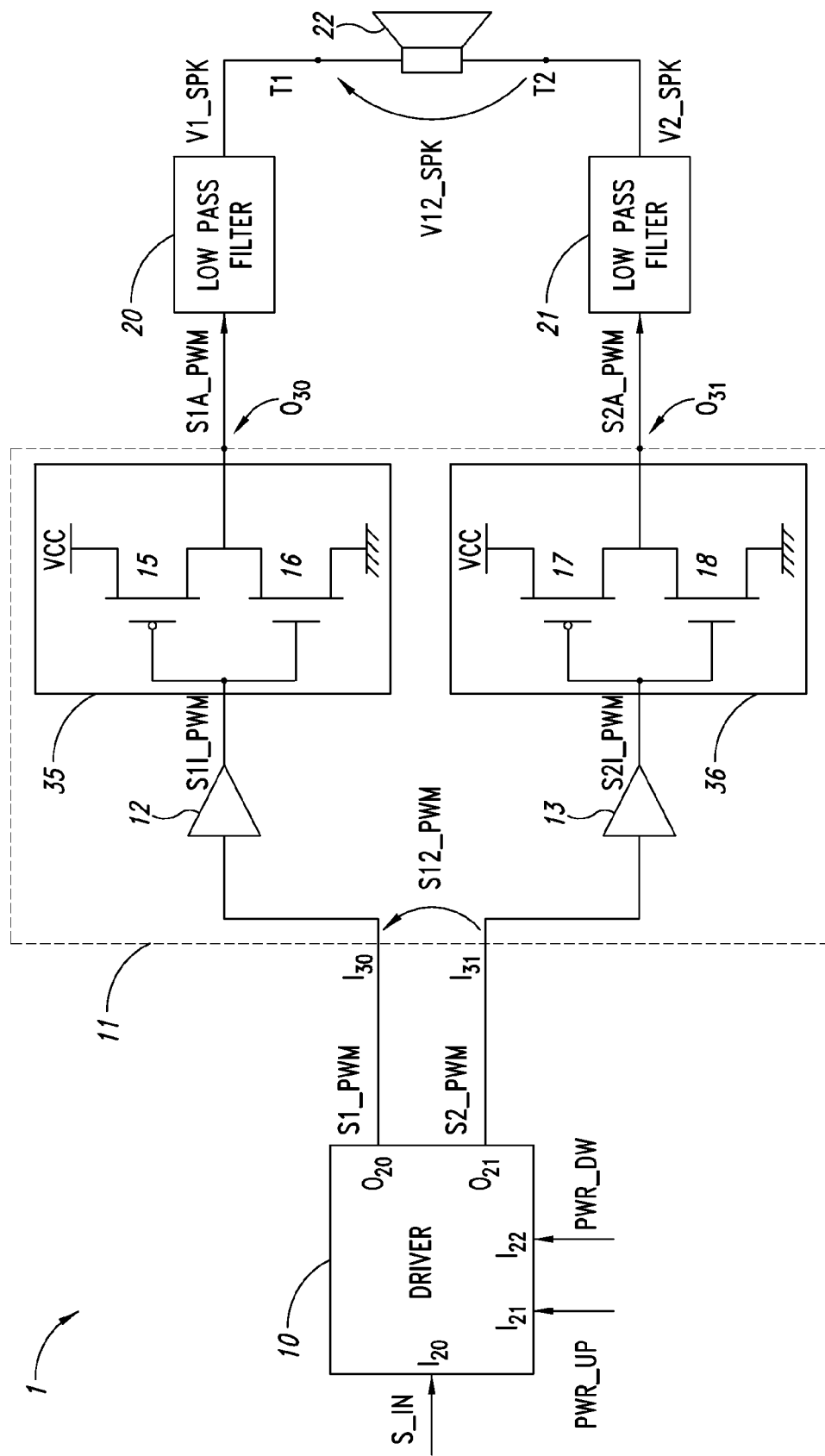
FIG. 1 schematically shows an amplification system according to a first embodiment of the disclosure.

With reference to FIG. 1, it is shown an amplification system 1 according to first embodiment of the disclosure.

The amplification system 1 comprises an electronic driver circuit 10, a switching amplifier 11, a first low-pass filter 20, a second low-pass filter 21 and a load 22.

For the purpose of explanation, for sake of simplicity it is supposed that the amplification system 1 is used in the audio field and that the input audio signal S_IN is of the digital type (for example, PCM type and coming from a digital audio source such as a Compact Disk), but the disclosure can be applied also in case the input audio signal S_IN is of the analog type. In the above assumption, the amplification system 1 is such to receive an input digital audio signal S_IN coming from the digital audio source, the low-pass filters 20 and 21 are such to filter the audio band and the load 22 is a speaker such to generate an audio signal corresponding to the input digital audio signal S_IN. However, it has to be noticed that the disclosure is applicable not only to the audio field for reducing the pop noise, but more generally the disclosure can be used for reducing or preventing the generation towards the load 22 of unwanted signals in the band (also different from the audio band) of filters 20, 21.

The driver circuit 10 has the function of generating a first and a second pulse driving signals S1_PWM, S2_PWM (for example, with a width modulation) for driving the switching amplifier 11, i.e., for example two pulse signals with a variable pulse width and not necessarily periodic. It has to be observed that the disclosure is applicable more in general to a driver circuit 10 comprising one or more output terminals such to generate one or more pulse driving signals (preferably, with a width modulation): for example, an electronic driver circuit 110 of the second embodiment of the disclosure shown in FIG. 4 comprises one output terminal for generating a pulse signal S101_PWM (preferably, with width modulation), as it will be explained in more detail below.

The driver circuit 10 comprises:
- an input terminal $I_{20}$ for receiving the audio digital signal S_IN, for example of the Pulse Code Modulation (PCM) type;
- a first input control terminal $I_{21}$ for receiving an activation signal PWR_UP for indicating the switch-on of the switching amplifier 11 or for indicating the transition of the switching amplifier 11 from a high-impedance state to a switching state;
- a second input control terminal $I_{22}$ for receiving a deactivation signal PWR_DW indicating the switch-off of the switching amplifier 11 or indicating the transition of the switching amplifier 11 from the switching state to the high impedance state;
- a first output terminal $O_{20}$ for generating a first driving signal S1_PWM such to carry a plurality of pulses (preferably, a square wave signal with pulse width modulation);
- a second output terminal $O_{21}$ for generating a second driving signal S2_PWM such to carry a plurality of pulses (preferably, a square wave signal with pulse width modulation).

In the following it will be denoted by differential driving signal S12_PWM the signal such to carry a plurality of pulses (for example, with width modulation), obtained by means of the difference between the first driving signal S1_PWM and the second driving signal S2_PWM; said differential driving signal S12_PWM is such to drive differentially the switching amplifier 11.

The driver circuit 10 is such to operate according to at least two modes:
- a switch-on operation mode;
- a normal operation mode.

It has to be observed that the switch-on or normal operation mode may be referred equivalently to the driver circuit 10 or to a controller 56 of the driver circuit (see FIG. 3) or to the amplification system 1.

Preferably, the driver circuit 10 is such to operate according to a further switch-off operation mode.

The switch-on operation mode is comprised between a starting instant $t_0$ and a final instant $t_{cf}$. The starting instant $t_0$ may be the instant when the switching amplifier 11 is switched on (and also the driver circuit 10 is powered-on) and thus from instant $t_0$ it is desired to prevent or reduce the generation of the pop noise from the speaker 22; instant $t_{cf}$ is the one wherein a valid input signal S_IN is received and thus the amplification system 1 is such to operate normally. Alternatively, at the instants prior to $t_0$ the switching amplifier 11 is already switched-on (and the driver circuit 10 is already powered-on) but it is in the high impedance state, i.e., half-bridges 35, 36 within the switching amplifier 11 are configured in a high impedance state; subsequently at the instant $t_0$ the half-bridges 35, 36 have a transition from the high-impedance state to the switching state and thus at the instant $t_0$ it is desired to avoid or reduce the generation of the pop noise from the speaker 22. It has to be noticed that in the present disclosure, "high impedance state" refers to a state of the switching amplifier 11 in which both the half-bridges 35, 36 are in the high-impedance state and "switching state" refers to a state of the switching amplifier 11 in which both of the half-bridges 35, 36 are switching.

The switch-off mode is subsequent to an instant wherein the switching amplifier 11 is switched off or it is subsequent to an instant wherein the switching amplifier 11 is still switched on and then it enters the high-impedance state.

Figure 2A:
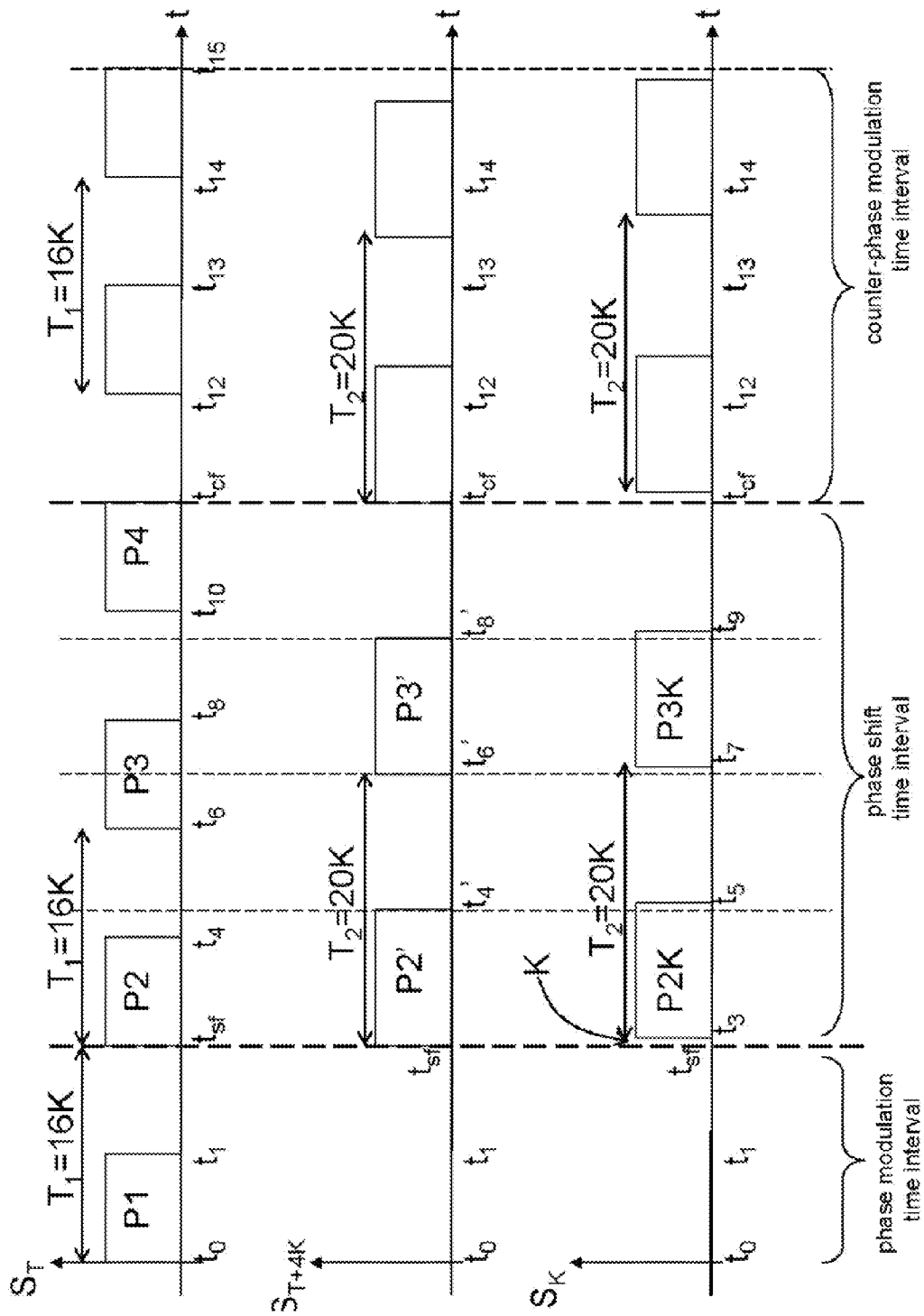
FIGS. 2A-2C schematically show a possible trend of some signals which may be generated in the amplification system according to the first embodiment.
Figure 2B:
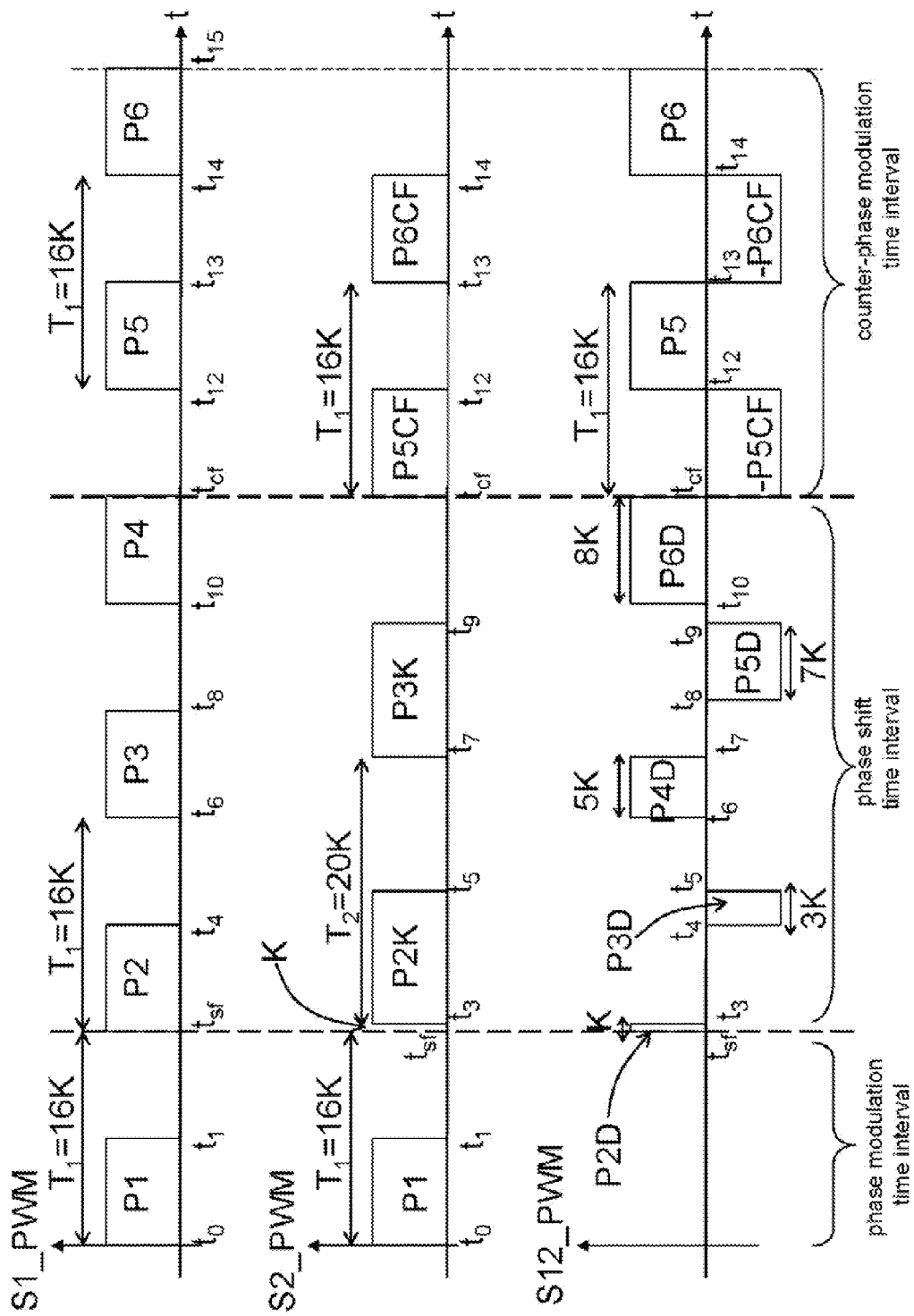

The switch-on operation mode comprises:
- a phase modulation time interval comprised between instant $t_0$ and an instant $t_{sf}$;
- a phase shift time interval comprised between instant $t_{sf}$ and instant $t_{cf}$, as shown in FIGS. 2A-B.

In the switch-on operation mode the driver circuit 10 is such to generate proper values of the pulses of the driving signal S1_PWM, S2_PWM, S12_PWM in order to minimize the pop noise, as it will be explained more in detail afterwards.

The normal operation mode comprises the instants subsequent to the final instant $t_{cf}$ and comprises:
- a counter-phase modulation time interval comprised between the final instant $t_{cf}$ and an instant $t_{15}$, wherein the speaker 22 is such to start to generate the audio signal as a function of the values of the input digital audio signal S_IN which, for sake of simplicity, it is assumed in FIGS. 2A-2B to have a null value;
- a time interval subsequent to instant $t_{15}$ (not shown in FIGS. 2A-B) wherein the speaker 22 is such to generate the sound signal in accordance with the input digital audio signal S_IN values that may assume arbitrary values.

The switching amplifier 11 (commonly denoted also by class-D amplifier) comprises:
- a first input terminal $I_{30}$ for receiving the first pulse driving signal S1_PWM, for example with width modulation;
- a first output terminal $O_{30}$ for providing a first amplified pulse signal S1A_PWM, for example with width modulation, obtained by the first half bridge 35 amplifying the first pulse driving signal S1_PWM;
- a second input terminal $I_{31}$ for receiving the second pulse driving signal S2_PWM, for example with width modulation;
- a second output terminal $O_{31}$ for providing a second amplified pulse signal S2A_PWM, for example with width modulation, obtained by the second half bridge 36 amplifying the second pulse driving signal S2_PWM.

It has to be noticed that the disclosure is applicable, more in general, to a switching amplifier which comprises at least one input terminal for receiving at least a respective input pulse signal (for example, a square wave pulse with width modulation) and comprises at least an output terminal for generating at least one output pulse signal (in the example, a square wave pulse with width modulation) obtained by amplifying the respective at least one input pulse signal. For example, a switching amplifier 111 of the second embodiment of the disclosure shown in FIG. 4 comprises an input terminal for receiving a pulse signal S101_PWM (for example, with width modulation) and comprises an output terminal for providing an amplified signal S101A_PWM, as it will be explained more in detail afterwards.

The switching amplifier 11 is of the differential half-bridge type and comprises:
- a first driving stage 12 configured to receive the first driving signal S1_PWM and, as a function of it, generate a first internal driving signal S1I_PWM;
- the first half-bridge amplifier 35 (implemented with a P-channel MOSFET transistor 15 and an N-channel MOSFET transistor 16) with supply voltage VCC, and configured to receive the first internal driving signal S1I_PWM and to generate the first amplified signal S1A_PWM obtained by amplifying the first internal driving signal S1I_PWM;
- a second driving stage 13 configured to receive the second driving signal S2_PWM and, as a function of it, generate a second internal driving signal S2I_PWM;
- the second half-bridge amplifier 36 (implemented with a P-channel MOSFET transistor 17 and an N-channel MOSFET transistor 18) with a supply voltage VCC (which, for sake of simplicity, is assumed to be equal that of the first half-bridge amplifier 35), and configured to receive the second internal driving signal S2I_PWM and to generate the second amplified driving signal S2A_PWM obtained by amplifying the second internal driving signal S2I_PWM.

It has to be observed that the high-impedance state of the half-bridge 35 may be achieved by driving the gate terminals of the MOSFET transistors 15 and 16 so that they are both closed; likewise, the high-impedance state of the half-bridge 36 may be achieved by driving the gate terminals of MOSFET transistors 17 and 18 so that they are both closed. Moreover, the switching state of the half-bridge 35 is achieved by driving the gate terminals of MOSFET transistors 15 and 16 so that they are alternately closed; likewise, the switching state of the half-bridge 36 is achieved by driving the gate terminals of MOSFET transistors 17 and 18 so that they are alternately closed.

It has to be noticed that, more in general, the half-bridge amplifiers 35, 36 are implemented with switches having respective control terminals driven by the driving stages 12, 13 respectively and said switches may be implemented with MOSFET transistors (as shown in FIG. 1) or with different types of components (for example, JFET or DMOS transistors). Moreover, the disclosure is can be used more in general also with types of switching amplifiers different from the full-bridge differential one, such as for example the half-bridge type (see for example the switching amplifier 111 of the second embodiment of the disclosure shown in FIG. 4), wherein the half-bridge may be implemented with two controlled switches implemented for example with a n-channel MOSFET and a p-channel MOSFET or implemented with two n-channel MOSFET transistors.

The first low-pass filter 20 comprises an input terminal for receiving the first amplified signal S1A_PWM and comprises an output terminal (connected to a first terminal T1 of the speaker 22) for providing a first filtered signal V1_SPK obtained by low-pass filtering (in particular, in the audio-band) the first amplified signal S1A_PWM.

The second low-pass filter 21 comprises an input terminal for receiving the second amplified signal S2A_PWM and comprises an output terminal (connected to a second terminal T2 of the speaker 22) for providing a second filtered signal V2_SPK obtained by low-pass filtering (in particular, in the audio-band) the second amplified signal S2A_PWM.

For example, the first low-pass filter 20 can be implemented with a first inductor connected between the input terminal and the output terminal of the first low-pass filter 20 and with a first capacitor connected between the output terminal of the first low-pass filter 10 and ground. Likewise, the second low-pass filter 21 can be implemented with a second inductor connected between the input terminal and the output terminal of the second low-pass filter 21 and with a second capacitor connected between the output terminal of the first low-pass filter 21 and ground.

Moreover, it has to be noticed that the disclosure may be applied, more in general, to an amplification system which comprises one or more low-pass filters: for example, the amplification system 101 of the second embodiment of the disclosure shown in FIG. 4 uses a low-pass filter 120, as it will be explained more in detail afterwards.

The speaker 22 comprises the first terminal T1 connected to the output terminal of the first low-pass filter 20 and comprises the second terminal T2 connected to the output terminal of the second low-pass filter 21.

It has to be noticed that the disclosure may be applied, more in general, to a load 22 which is a diffuser such to generate an audio signal, such as, for example, a speaker, headphones or earphones.

Referring to FIG. 2B, it shows the trends of the first driving signal S1_PWM, of the second driving signal S2_PWM and of the differential driving signal S12_PWM. For the purpose of explanation, it is supposed for sake of simplicity to use the square wave pulse signals S1_PWM, S2_PWM, S12_PWM, but more in general the disclosure may be applied to the pulse signals S1_PWM, S2_PWM, S12_PWM with a waveform different from the square wave, wherein it's possible to define a pulse width (for example, the waveform may be that of a sinusoid wherein the width of an arc of the sinusoid is defined as the distance between two values of the arc with a width equal to a certain percentage–for example 70%–of the maximum amplitude value).

It may be observed that three time intervals are present:
- the phase modulation time interval comprised between instant $t_0$ and instant $t_{sf}$;
- the phase shift time interval comprised between instant $t_{sf}$ and instant $t_{cf}$;
- the counter-phase modulation time interval comprised between instant $t_{cf}$ and instant $t_{15}$.

In particular, in the phase modulation time interval the first driving signal S1_PWM and the second driving signal S2_PWM are pulses phase aligned each other and, preferably, they are periodic square wave pulses with a period $T_1$ and square wave pulse width equal to half of period $T_1$ (this is commonly referred to also as a duty-cycle signal equal to 50%); as a result, the differential driving signal S12_PWM is null. The phase modulation time interval has the function of bringing the common mode signal of the switching amplifier 11 at the steady value that (in the first embodiment of the disclosure) is such that the voltage value of the terminals T1, T2 of the speaker 22 is equal to VCC/2, wherein VCC is the supply voltage of the first half-bridge amplifier 35 and of the second half-bridge amplifier 36.

In the phase shift time interval the first driving signal S1_PWM is periodic with a period $T_1$ and it has a 50% duty-cycle (i.e., the width of the pulses is equal to $T_1/2$), while the second driving signal S2_PWM is periodic with a period $T_2$ greater than $T_1$—preferably $T_2=T_1+4*K$, wherein K is a fraction of $T_1$, as it will be explained more in detail afterwards—and it has a 50% duty cycle (i.e., the pulse width is equal to $T_2/2$) and moreover the first pulse of the second driving signal S2_PWM is phase shifted by a value K which is a fraction of period $T_1$, as it will be explained more in detail afterwards; as a result, the differential driving signal S12_PWM is a pulse signal with an pulse width increasing according to particular values, as it will be explained more in detail afterwards. The length of the phase shift time interval is predetermined and, preferably, it is equal to $(T_1/2)*[T_1/(4*K)+1]$, as it will be explained more in detail afterwards.

In the counter-phase modulation time interval the first driving signal S1_PWM and the second driving signal S2_PWM are counter-phased to each other (i.e., they are phase shifted by 180°) and, preferably, they are periodic square wave pulses with a period $T_1$ and 50% duty-cycle; as a consequence, the differential driving signal S12_PWM is a pulse signal with both a positive and a negative pulse width and, preferably, it is periodic with a period $T_1$ and 50% duty-cycle.

The Applicant has noticed that the presence of asymmetries between the half-bridge amplifier 35 and the half-bridge amplifier 36 cause (when switching-on the switching amplifier 11 or at the instant of the transition of the switching amplifier 11 from the high-impedance state to the switching state) the generation of a differential signal V12_SPK (filtered according to the ITU-R 468 standard) at the terminals of the speaker 22 which is not null for an input signal S_IN which is null, such to have a trend having spectral components inside the audio band, thus causing the generation of the pop noise. Furthermore, the Applicant has noticed that the pop noise is particularly reduced by using the switch-on operation mode, in particular the phase-shift time interval, and generating therein a plurality of pulses of the differential driving signal S12_PWM with a pulse width increasing between contiguous pulses according to a step value having modulus equal to two and odd values and furthermore with a polarity alternating between the contiguous pulses. In other words, the width of subsequent pulses of the differential driving signal S12_PWM in the switch-on operation mode has, for example, the following values, as shown in FIG. 2A:

K, with a positive polarity;
3*K, with a negative polarity;
5*K, with a positive polarity;
7*K, with a negative polarity;
...

wherein K is a proper value, which will be defined afterwards.

Alternatively, the differential driving signal S12_PWM in the switch-on operation mode has for example the following values:

K, with a negative polarity;
3*K, with a positive polarity;
5*K, with a negative polarity;
7*K, with a positive polarity;
...

Preferably, the differential driving signal S12_PWM in the phase shift time interval of the switch-on operation mode and in the normal operation mode is periodic with a period $T_1$; moreover, the value of K is a fraction of said period $T_1$.

Advantageously, the length of the phase shift time interval (i.e., the time interval comprised between the instants $t_{sf}$ and $t_{cf}$) is equal to $(T_1/2)*[T_1/(4*K)+1]$ and the relationship between K and $T_1$ is the following: $K=T_1/(8*n)$, wherein n is a configuration parameter of the amplification system 1 which may assume integer values (i.e., n=1, 2, 3, ...). These values allow a particularly efficient reduction of pop noise; moreover, such a reduction increases upon the increase of the integer n value.

FIG. 2B shows in particular the driving signals S1_PWM, S2_PWM, S12_PWM in the assumption that the integer number n=2 (thus $K=T_1/16$) and in assumption that the period of the second driving signal S2_PWM is $T_2=T_1+4*K$ (thus $T_2=16*K+4*K=20*K$). In these cases, in the phase modulation time interval the first driving signal S1_PWM and the second driving signal S2_PWM are periodic with a period 16*K, have a square wave pulse width equal to 8*K and are phase aligned each other; as a consequence, the differential driving signal S12_PWM is null. In the phase shift time interval the first driving signal S1_PWM is periodic with a period 16*K and the pulse width is equal to 8*K, whereas the second driving signal S2_PWM is periodic with a period 20*K and the pulse width is equal to 10*K and furthermore the pulse P2K of the second driving signal S2_PWM is phase shifted by the value K. As a result, the differential driving signal S12_PWM is a pulse signal with an pulse width increasing between subsequent pulses according to a step value having modulus equal to two and odd values and furthermore with a polarity alternating between the subsequent pulses according to values K (with a positive polarity), 3*K with a negative polarity), 5*K (with a positive polarity), 7*K (with a negative polarity), . . . . In the counter-phase modulation time interval the first driving signal S1_PWM and the second driving signal S2_PWM are periodic with a period 16*K, have a square wave pulse width equal to 8*K and are counter-phased each other; as a consequence, the differential driving signal S12_PWM is a periodic pulse signal with a period 16*K, square wave pulse width equal to 8*K and amplitude of the pulses both positive and negative.

Analogously, the pop noise in a switch-off operation mode is particularly reduced by generating pulses of the differential driving signal S12_PWM with a width decreasing between subsequent pulses according to a step value having modulus equal to two and odd values and furthermore with a polarity alternating between the subsequent pulses. In other words, the width of subsequent pulses of the differential driving signal S12_PWM in the switch-off operation mode has for example the following values:

7*K, with a negative polarity;
5*K, with a positive polarity;
3*K, with a negative polarity;
K, with a positive polarity.

Figure 2C:
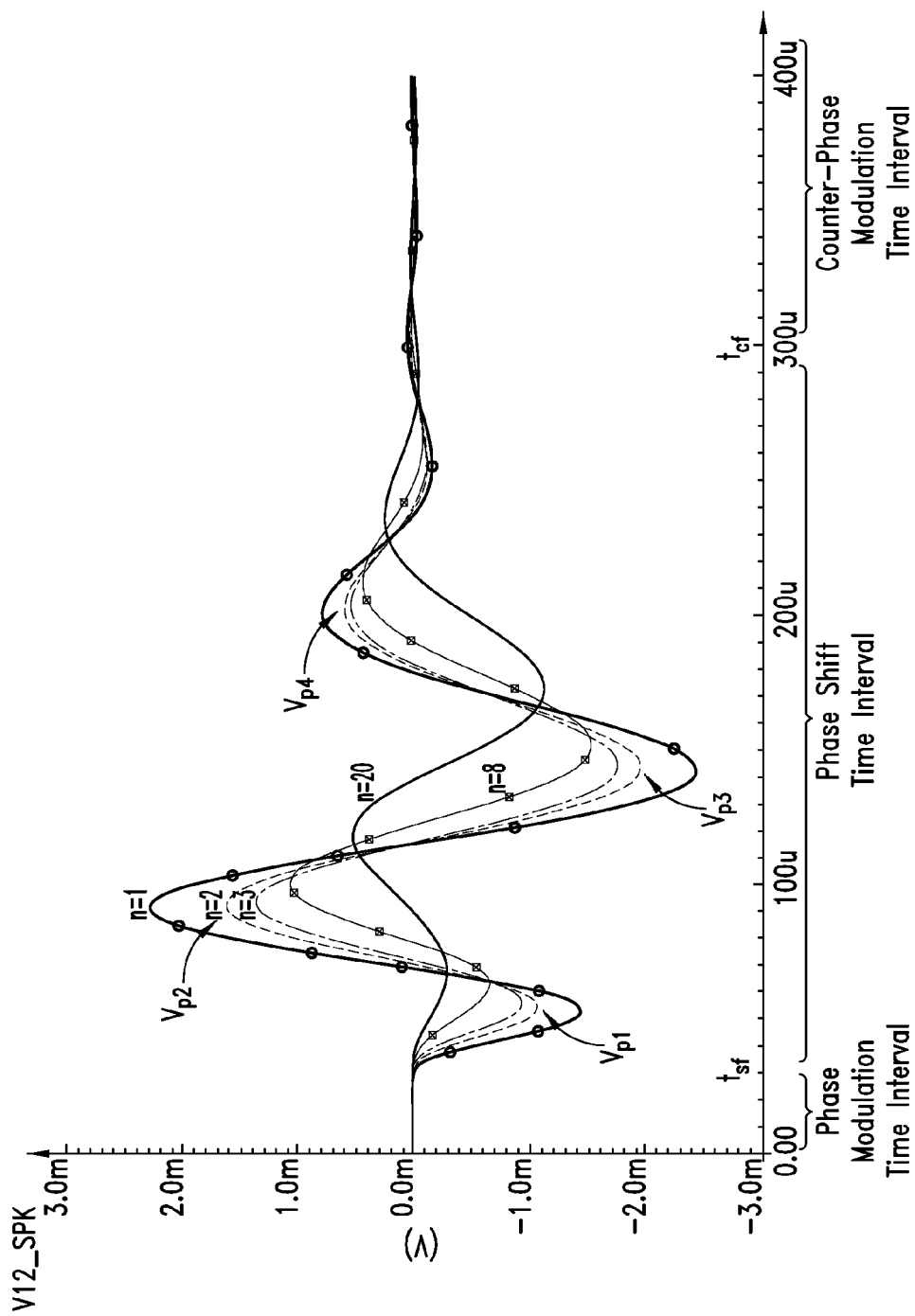

Referring to FIG. 2C, it shows the trend of the differential voltage signal V12_SPK at the terminals of the speaker 22, taking as a reference the filter defined in the ITU-R 468 standard, in the amplification system 1 of the first embodiment of the disclosure, in the following assumptions:

supply voltage VCC=25 volts;
speaker with impedance of 4Ω;
first low-pass filter 20 and second low-pass filter 21 implemented with an inductor and a capacitor, with values of 10 µH and 1 µF respectively;
period $T_1$ equal to 2.8 µs (which corresponds to a frequency $f_1$ equal to about 357 Khz).

It is possible to notice that the pop noise in the instants subsequent to $t_0$ is reduced, in particular the differential voltage V12_SPK (weighed with respect to the filter defined in the standard ITU-R 468) has peak-to-peak values lower than 4.7 $mV_{pp}$, thus lower than the minimum audibility value generally set at 7.5 $mV_{pp}$.

Moreover, it is possible to notice that the peaks of the differential voltage signal V12_SPK (ITU-R 468 filtered) in the switch-on operation mode decrease upon the increase of the integer number n and thus the reduction of the pop noise is greater upon the increase of the integer number n.

Figure 3:
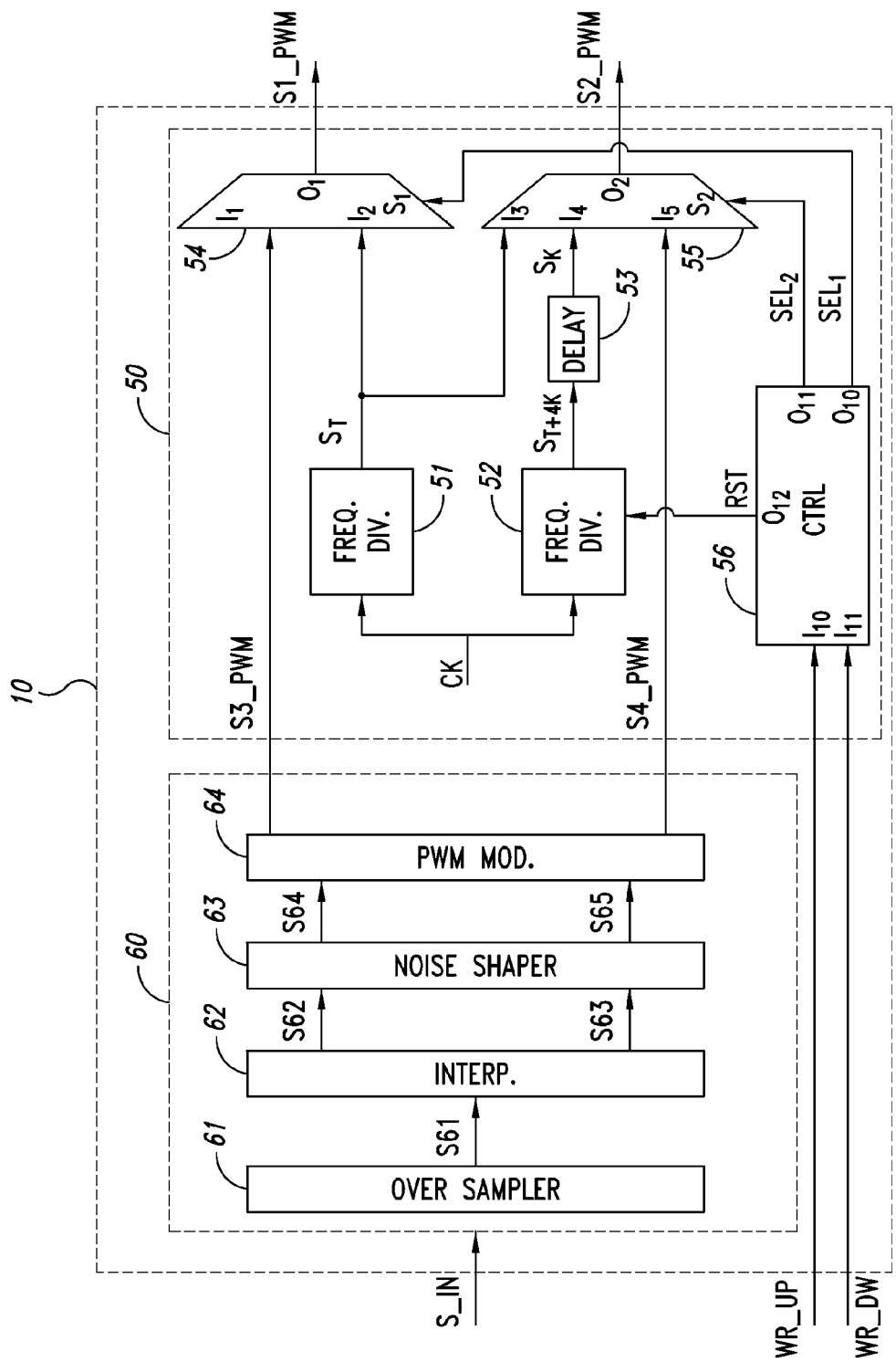
FIG. 3 schematically shows a possible implementation of an electronic circuit which can be used in the amplification system according to the first embodiment of the disclosure.

With reference to FIG. 3, it is shown a possible implementation of the driver circuit 10.

The driver circuit 10 comprises a converter 60 and a pulse generator 50 connected to each other.

The converter 60 has the function of performing the conversion of the input audio digital signal S_IN (for example, of the Pulse Code Modulation PCM type) into a first and a second audio signals S3_PWM, S4_PWM with a pulse width modulation.

The converter 60 comprises:
- an oversampler 61;
- an interpolator 62;
- a noise shaper 63;
- a pulse width modulator 64.

The oversampler 61 has an input terminal and an output terminal and has the function of providing on the output terminal an oversampled signal S61 obtained by oversampling the input audio digital signal S_IN received on the input terminal. For example, the oversampler 61 is such to provide on the output terminal an oversampled signal obtained first by inserting samples with null value between two subsequent samples of the input audio digital signal S_IN and then digitally filtering the unwanted spectral replications generated by inserting the samples with null value.

The interpolator 62 comprises an input terminal for receiving the oversampled signal S61 and comprises two output terminals such to provide a first and a second sequence of samples S62 and S63 respectively indicating time instants of the input digital audio signal S_IN. For example, the interpolator 62 comprises a saw-tooth generator configured to generate a first and a second saw-tooth periodic modulating signal; moreover, the interpolator 62 is such to generate an interpolated signal obtained by interpolating the oversampled signal S61 and the quantized samples of the first and second sequences S62 and S63 are obtained by means of the intersections between the interpolated signal and the first and second modulating saw-tooth signals, respectively.

The noise shaper 63 comprises two input terminals for receiving the first and second sequences of samples S62 and S63 respectively and comprises two output terminals for providing a third and a fourth sample sequence S64 and S65 quantized with a lower bit number (lower than the bit number of the quantized samples of the first and of the second sequences S62 and S63) and with a lower noise in the frequency band of the input digital audio signal S_IN; therefore also the third and fourth sample sequences S64 and S65 indicate the time instants of the input audio signals S_IN.

The pulse width modulator 64 (PWM) comprises a first and a second input terminal for receiving the third and fourth sample sequences S64 and S65 and it further comprises a first and a second output terminal for generating the first and the second pulse width modulated audio signals S3_PWM, S4_PWM, respectively, wherein the pulse width of the first and the second pulse audio signals S3_PWM, S4_PWM is a function of the values of the third and of the fourth sample sequences S64 and S65, respectively.

It has to be noticed that the disclosure is not limited to the generation of pulses with pulse width modulation, but it may be applied also to pulses with other types of modulation, such as for example frequency or sigma-delta modulation.

The pulse generator 50 is such to receive the activation signal PWR_UP, the deactivation signal PWR_DW, a clock signal CK, the first and second pulse audio signal S3_PWM, S4_PWM and, as a function of them, it is such to generate the first driving signal S1_PWM and the second driving signal S2_PWM.

In particular, the pulse generator 50 comprises a controller 56, a first frequency divider 51, a second frequency divider 52, a delay block 53, a first multiplexer 54 and a second multiplexer 55.

The first frequency divider 51 is such to receive, when the electronic circuit 10 is operating in the switch-on operation mode, the clock signal CK with period K, wherein $K=T_1/(8*n)=$(with n=2) $T_1/16$. Moreover, the first frequency divider 51 is such to generate, when the electronic circuit 10 is operating in the switch-on operation mode, a first periodic signal $S_T$ with period $T_1=K*8*n=$(with n=2) $16*K$ and with a 50% duty-cycle (see signal S1_PWM in FIG. 2A), wherein the first periodic signal $S_T$ is obtained by dividing the clock signal CK frequency by a value equal to $8*n=$(n=2) 16.

The second frequency divider 52 is such to receive, when the electronic circuit 10 is operating in the phase shift time interval, the clock signal CK with a period K and a reset signal RST and, as a function of them, it is such to generate, when the electronic circuit 10 is operating in the phase shift time interval, a second periodic signal $S_{T+4K}$ with a period $T_1+4*K$ and with a 50% duty-cycle (see the signal S2_PWM in FIG. 2A), wherein the second periodic signal $S_{T+4K}$ is obtained by means of the frequency division of the clock signal CK by a value $(8*n+4)=$(with n=2) 20, wherein $T_1=K*8*n=$(with n=2) $16*K$ and n has the same value (2 in the example considered) used for generating the first periodic signal $S_T$.

The delay block 53 is such to receive, when the electronic circuit 10 is operating in the phase shift time interval, the second periodic signal $S_{T+4K}$ and it is such to generate a third periodic signal $S_K$ obtained by delaying the second periodic signal $S_{T+4K}$ of the value K (see pulse P2K of the signal S2_PWM in the FIG. 2A).

The first multiplexer 54 comprises a first input terminal $I_1$, a second input terminal $I_2$, an input selection terminal $S_1$ and an output terminal $O_1$. Furthermore, it is configured to: receive a first selection signal $SEL_1$ on the input selection terminal $S_1$, receive the first periodic signal $S_T$ on the first input terminal $I_1$, receive the first pulse audio signal S3_PWM on the second input terminal $I_2$, and generate on the output terminal $O_1$ the first driving signal S1_PWM equal to the first periodic signal $S_T$ or to the pulse audio signal S3_PWM, as a function of the first selection value $SEL_1$, as it will be explained more in detail afterwards.

The second multiplexer 55 comprises a first input terminal $I_3$, a second input terminal $I_4$, a third input terminal $I_5$, an input selection terminal $S_2$ and an output terminal $O_2$. Furthermore, it is such to receive a second selection signal $SEL_2$ on the input selection terminal $S_2$, it is configured to: receive the first periodic signal $S_T$ on the first input signal $I_3$, receive the third periodic signal $S_K$ on the second input terminal $I_4$, receive the second pulse audio signal S4_PWM on the third input terminal $I_5$, and generate on the output terminal $O_2$ the second driving signal S2_PWM equal to the first periodic signal $S_T$ or the third periodic signal $S_K$ or the second pulse audio signal S4_PWM, as a function of the value of the second selection signal $SEL_2$, as it will be explained more in detail afterwards.

The controller 56 comprises a first input terminal $I_{10}$, a second input terminal $I_{11}$, a first output terminal $O_{10}$, a second output terminal $O_{11}$ and a third output terminal $O_{12}$ and is configured to: receive the activation signal PWR_UP on the first input terminal $I_{10}$, receive the deactivation signal PWR_DW on the second input terminal $I_{11}$ and, as a function of them, generate the first selection signal $SEL_1$ on the first output terminal $O_{10}$, the second selection signal $SEL_2$ on the second output terminal $O_{11}$ and the reset signal RST on the third output terminal $O_{12}$, as it will be explained more in detail afterwards. Preferably, the controller 56 is such to include a configuration register for storing the length of the phase shift time interval.

It has to be observed that generating the driving signals S1_PWM, S2_PWM, S12_PWM in the switch-on operation mode is achieved by interposing the pulse generator 50 between the output signals from the pulse width modulator 64 and the input signals to the switching amplifier 11, but such driving signals S1_PWM, S2_PWM, S12_PWM—in particular, the generation of the plurality of pulses with a pulse width increasing between adjacent pulses according to a step value having modulus equal to two and odd values and a polarity alternating between the contiguous pulses—may be also generated differently. For example, it is possible to implement the driver circuit 10 by modifying the modulating signal which determines the generation of the pulse width modulated signals S1_PWM, S2_PWM.

According to another example, a completely digital embodiment is possible by storing the sample values of the driving signals S1_PWM, S2_PWM, S12_PWM to be generated in the switch-on operation mode.

It will be described hereinafter the operation of the amplification system 1, referring also to FIGS. 1, 2A-C and 3. In particular, it will be described the operation in the switch-on mode and at the beginning of the normal operation mode.

For the purpose of explanation of the disclosure, it is assumed that the integer number n=2 and thus that the relationship between $T_1$ and K is $K=T_1/(8*n)=T_1/16$, i.e., $T_1=16*K$; furthermore, it is assumed that the phase shift time interval is equal to $(T_1/2)*[T_1/(4*K)+1]$. FIGS. 2A and 2B schematically show the trend of the signals in such assumptions.

At the starting instant $t_0$ and at the instants before the starting instant $t_0$ (i.e., before the switching amplifier 11 is switched on or before the transition of the switching amplifier from the high-impedance state to the switching state), the value of the voltage of the first filtered signal V1_SPK and of the second filtered signal V2_SPK is substantially null; as a result, the differential voltage value V12_SPK (filtered ITU-R 468) at the starting instant $t_0$ is substantially null.

Moreover, it is assumed that the value of the input audio digital signal S_IN is null at the starting instant $t_0$ (and at the instants prior thereto) until the instant $t_{sf}$, i.e., until the end of the switch-on operation mode.

At the instant $t_0$ the amplification system receives the activation signal PWR_UP with a high logic value indicating the switch-on of the switching amplifier 11 (or indicating the transition of the switching amplifier 11 from the high impedance state to the switching state).

The controller 56 receives on the first input terminal $I_{10}$ the activation signal PWR_UP having the high logic value and the electronic circuit 10 enters the switch-on operation mode, in particular in the phase modulation time interval; moreover, the controller 56 generates on the first output terminal $O_{10}$ the first selection signal $SEL_1$ having a value indicating the second input terminal $I_2$ of the multiplexer 54 and generates on the second output terminal $O_{11}$ the second selection signal $SEL_2$ having a value indicating the selection of the first input terminal $I_3$ of the multiplexer 55.

The first frequency divider 51 receives the clock signal CK and in the phase modulation time interval (comprised between the instants $t_0$ and $t_{sf}$) it generates the first square wave periodic signal $S_T$ with period $T_1=16*K$ and 50% duty-cycle, i.e., having a positive pulse P1 with width $T_1/2=16*K/2=8*K$ between the instants $t_0$ and $t_1$ and a null value between the instants $t_1$ and $t_{sf}$ (see FIG. 2A).

At the instants comprised between $t_0$ and $t_{sf}$ the first multiplexer 54 receives on the second input terminal $I_2$ the first periodic signal $S_T$, receives on the input selection terminal $S_1$ the first selection signal $SEL_1$ having the value indicating the selection of the second input terminal $I_2$ and transmits on the output terminal $O_1$ the first square wave driving signal S1_PWM equal to the value of the first periodic signal $S_T$ and thus having the positive pulse P1 with width $8*K$ between the instants $t_0$ and $t_1$ and a null value between the instants $t_1$ and $t_{sf}$.

Analogously, at the instants comprised between $t_0$ and $t_{sf}$ the second multiplexer 55 receives on the first input terminal $I_3$ the first periodic signal $S_T$, it receives on the input selection terminal $S_2$ the second selection signal $SEL_2$ having the value indicating the selection of the first input terminal $I_3$ and transmits on the output terminal $O_2$ the second square wave driving signal S2_PWM equal to the value of the first periodic signal $S_T$ and thus having the positive pulse P1 with width $8*K$ between the instants $t_0$ and $t_1$ and with a null value between the instants $t_1$ and $t_{sf}$.

The values of the differential driving signal S12_PWM are calculated by means of the difference between the values of the first driving signal S1_PWM and the values of the second driving signal S2_PWM. Therefore at the instants comprised between $t_0$ and $t_{sf}$ the trend of the differential driving signal S12_PWM is the difference between the pulses P1 of the first and of second driving signals S1_PWM and S2_PWM which have the same trend and thus the differential driving signal S12_PWM has null values at the instants comprised between $t_0$ and $t_{sf}$.

At the instants comprised between $t_0$ and $t_{sf}$ the first driving stage 12 receives the first square wave driving signal S1_PWM having the positive pulse P1 with width $8*K$ between instants $t_0$ and $t_1$ and with a null value between the instants $t_1$ and $t_{sf}$ and, as a function of them, it generates the first internal square wave driving signal S1I_PWM having a positive pulse P1I with width $8*K$ between the instants $t_0$ and $t_1$ and with a null value between the instants $t_1$ and $t_{sf}$, wherein the pulse P1I is such to be able of driving the gate terminals of MOSFETs 15 and 16.

Analogously, at the instants comprised between $t_0$ and $t_{sf}$ the second driving stage 13 receives the second square wave driving signal S2_PWM having the positive pulse P1 with width $8*K$ between instants $t_0$ and $t_1$ and with a null value between the instants $t_1$ and $t_{sf}$ and, as a function of them, it generates the second internal square wave driving signal S2I_PWM having the positive pulse P1I with width $8*K$ between the instants $t_0$ and $t_1$ and with a null value between the instants $t_1$ and $t_{sf}$, wherein the pulse P1I is such to be able of driving the gate terminals of MOSFETs 17 and 18. The first half-bridge amplifier 35 receives at the input the first internal driving signal S1I_PWM and it provides therefrom at the output the first square wave amplified signal S1A_PWM having a positive pulse P1A with width $8*K$ between instants $t_0$ and $t_1$ and an amplitude greater than the width of the pulse P1I of the first internal driving signal S1I_PWM and having a null value between instants $t_1$ and $t_{sf}$.

The second half-bridge amplifier 36 receives at the input the second internal driving signal S2I_PWM and it provides therefrom at the output the second amplified signal S2A_PWM having the pulse P1A between instants $t_0$ and $t_1$ and having a null value between instants $t_1$ and $t_{sf}$.

The first low-pass filter 20 receives on the input terminal the first amplified signal S1A_PWM having the positive pulse P1A and it generates therefrom on its output terminal the first filtered signal V1_SPK having approximately the same trend as a parabola arc P1SM comprised between instants $t_0$ and $t_{sf}$. In particular, at the instant $t_{sf}$ the voltage value of the first filtered signal V1_SPK is almost equal to VCC/2, wherein VCC is the supply voltage of the first half-bridge amplifier 35 and of the second half-bridge amplifier 36. The second low-pass filter 21 receives on the input terminal the second amplified signal S2A_PWM having the pulse P1A and it generates therefrom on its output terminal the second filtered signal V2_SPK having substantially the same trend as that of the first filtered signal V1_SPK, that is the trend of P1SM between the instants $t_0$ and $t_{sf}$. In particular, at the instant $t_{sf}$ the voltage value of the second filtered signal V2_SPK is almost the same as VCC/2. The speaker 22 receives on the first terminal T1 the first filtered signal V1_SPK and receives on the second terminal T2 the second filtered signal V2_SPK having substantially the same trend, i.e., that of P1SM at the instants comprised between $t_0$ and $t_{sf}$, and thus the value of the differential voltage signal V12_SPK (filtered ITU-R 468) at the ends of the speaker 22 is substantially null at the instants comprised between $t_0$ and $t_{sf}$, as shown in the phase modulation time interval in FIG. 2C.

It has to be observed that, for sake of simplicity, it was assumed that the phase modulation time interval comprises only one pulse P1 and that said pulse is sufficient to bring the voltage of the first filtered signal V1_SPK and of the second filtered signal V2_SPK to the value VCC/2, but more generally in the phase modulation time interval more than one pulse may be present.

At instant $t_{sf}$ the driver circuit 10 enters the phase-shift time interval (comprised between $t_{sf}$ and $t_{cf}$) in the switch-on operation mode.

At instant $t_{sf}$ the controller 56 reads the configuration register value indicating the length of the phase-shift time interval (which is assumed to be equal to $(T_1/2)*[T_1/(4*K)+1]$), it generates on the first output terminal $O_{10}$ the first selection signal $SEL_1$ having a value indicating the selection from the second input terminal $I_2$ of the multiplexer 54 and it generates on the second output terminal $O_{11}$ the second selection signal $SEL_2$ having a value indicating the selection from the second input terminal $I_4$ of the multiplexer 55.

The first frequency divider 51 receives the clock signal CK and in the phase shift time interval it generates the first square wave periodic signal $S_T$ with period $T_1=16*K$ and 50% duty-cycle, i.e., having a positive pulse P2, a positive pulse P3, a positive pulse P4 having width $T_1/2=16*K/2=8*K$ between the instants $t_{sf}$-$t_4$, $t_6$-$t_s$, $t_{10}$-$t_{cf}$ respectively and having a null value between instants $t_4$-$t_6$, $t_s$-$t_{10}$.

At the instant $t_{sf}$ the second frequency divider 52 receives the clock signal CK, receives the reset signal RST having a value indicating the activation of the second frequency divider 52 and it generates the second periodic signal $S_{T+4K}$ having a square wave pulse P2' phase aligned with the pulse P2 generated by the first frequency divider 51. Afterwards, in the phase shift time interval the second frequency divider 52 generates the second square wave periodic signal $S_{T+4K}$ having a period $T_2=20*K$ and 50% duty-cycle, i.e., having the positive pulse P2' and a positive pulse P3' having width $T_2/2=10*K$ between the instants $t_{sf}$-$t_4$' and $t_6$'-$t_8$' respectively and with a null value between the instants $t_4$'-$t_6$' and $t_s$'-$t_{cf}$.

The delay block 53 receives the second periodic signal $S_{T+4K}$ and generates the third square wave periodic signal $S_K$ obtained by delaying the second periodic signal $S_{T+4K}$ with a value K, i.e., it generates a positive pulse P2K having width $T_2/2=10*K$ between the instants $t_3$ and $t_5$, wherein $t_3$ is subsequent in time to $t_{sf}$ of the value K, and it generates a positive pulse P3K having width $T_2/2=10*K$ between the instants $t_7$ and $t_9$, and a null value between instants $t_{sf}$-$t_3$, $t_5$-$t_7$, $t_9$-$t_{cf}$.

At the instants comprised between $t_{sf}$ and $t_{cf}$ the first multiplexer 54 receives on the second input terminal $I_2$ the first periodic signal $S_T$, it receives on the selection input terminal $S_1$ the first selection signal $SEL_1$ having the value indicating the selection from the second input terminal $I_2$ and transmits on the output terminal $O_1$ the first square wave driving signal S1_PWM equal to the value of the first periodic signal $S_T$ and thus having the pulse P2, the pulse P3, the pulse P4 having width 8*K between instants $t_{sf}$-$t_4$, $t_6$-$t_8$, $t_{10}$-$t_{cf}$ respectively and a null value between instants $t_4$-$t_6$, $t_s$-$t_{10}$.

Analogously, at the instants comprised between $t_{sf}$ and $t_{cf}$ the second multiplexer 55 receives on the second input terminal $I_4$ the third periodic signal $S_K$, it receives on the input selection terminal $S_2$ the second selection signal $SEL_2$ having the value indicating the selection from the second input terminal $I_4$ and transmits on the output terminal $O_2$ the second square wave driving signal S2_PWM equal to the value of the third periodic signal $S_K$ and having the positive pulse P2K with width $T_2/2=10*K$ between the instants $t_3$ and $t_5$ and the positive pulse P3K with width $T_2/2=10*K$ between the instants $t_7$-$t_9$ and having a null value between the instants $t_{sf}$-$t_3$, $t_5$-$t_7$, $t_9$-$t_{cf}$.

The values of the differential driving signal S12_PWM are calculated by means of the difference between the values of the first driving signal S1_PWM and the values of the second driving signal S2_PWM and thus at the instants comprised between $t_{sf}$ and $t_{cf}$ the differential driving signal S12_PWM is a periodic square wave having a period 16*K and it has the following values:

a positive pulse P2D with width K at the instants comprised between $t_{sf}$ and $t_3$;
null values at the instants comprised between $t_3$ and $t_4$;
a negative pulse P3D with width 3*K at the instants comprised between $t_4$ and $t_5$;
null values at the instants comprised between $t_5$ and $t_6$;
a positive pulse P4D with width 5*K at the instants comprised between $t_6$ and $t_7$;
null values at the instants comprised between $t_7$ and $t_8$;
a negative pulse P5D with width 7*K at the instants comprised between $t_8$ and $t_9$;
null values at the instants comprised between $t_9$ and $t_{10}$;
a positive pulse P6D with width 8*K at the instants comprised between $t_{10}$ and $t_{cf}$.

At the instants comprised between $t_{sf}$ and $t_{cf}$ the first driving stage 12 receives the first square wave driving signal S1_PWM having the pulse P2, the pulse P3, the pulse P4 and, as a function of them, it generates the first internal square wave driving signal S1I_PWM having a positive pulse P2I with width $T_2/2=10*K$ between instants $t_{sf}$ and $t_4$, a positive pulse P3I with width $T_2/2=10*K$ between instants $t_6$-$t_8$, a positive pulse P4I between instants $t_{10}$-$t_{cf}$ respectively and having a null value between instants $t_4$-$t_6$, $t_8$-$t_{10}$.

Analogously, at the instants comprised between $t_{sf}$ and $t_{cf}$ the second driving stage 13 receives the second square wave driving signal S2_PWM having the positive pulse P2K and the positive pulse P3K and, as a function of them, it generates the second internal square wave driving signal S2I_PWM having the positive pulse P2KI with width $T_2/2=10*K$ between the instants $t_3$ and $t_5$ and the positive pulse P3KI with width $T_2/2=10*K$ between the instants $t_7$ and $t_9$ respectively and having a null value between the instants $t_{sf}$-$t_3$, $t_5$-$t_7$, $t_9$-$t_{cf}$.

The first half-bridge amplifier 35 receives on the input the first internal driving signal S1I_PWM and it provides therefrom at the output the first square wave amplified signal S1A_PWM having a positive pulse P2A, a positive pulse P3A and a positive pulse P4A having a width $T_1/2=16*K=8*K$ between the instants $t_{sf}$-$t_4$, $t_6$-$t_8$, $t_{10}$-$t_{cf}$ respectively and an amplitude greater than the amplitude of the pulse P2I, of the pulse P3I, of the pulse P4I of the first internal driving signal S1I_PWM respectively and with a null value between the instants $t_4$-$t_6$, $t_8$-$t_{10}$.

The second half-bridge amplifier 36 receives on the input the second internal driving signal S2I_PWM and it provides therefrom at the output the second square wave amplified signal S2A_PWM having a positive pulse P2KA and a positive pulse P3KA having a width $T_2/2=10*K$ between the instants $t_3$-$t_5$, $t_7$-$t_9$ respectively, and an amplitude greater than the amplitude of the pulse P2KI and of the pulse P3KI of the second internal driving signal S2I_PWM respectively and having a null value between the instants $t_{sf}$-$t_3$, $t_5$-$t_7$, $t_9$-$t_{cf}$.

The first low-pass filter 20 receives on the input terminal the first amplified signal S1A_PWM having the positive pulse P2A, the positive pulse P3A and the positive pulse P4A and it generates therefrom on its output terminal the first filtered signal V1_SPK having a trend approximately equal to parabola arcs P2SM, P3SM, P4SM connected to each other comprised between instants $t_{sf}$-$t_{cf}$. In particular, at the instant $t_{cf}$ the value of the voltage of the first filtered signal V1_SPK is almost equal to VCC/2.

The second low-pass filter 21 receives on the input terminal the second amplified signal S2A_PWM having the positive pulse P2KA and the positive pulse P3KA and it generates therefrom on its output terminal the second filtered signal V2_SPK having a trend approximately equal to parabola arcs P2KSM, P3KSM connected to each other comprised between instants $t_{sf}$ and $t_{cf}$. In particular, at the instant $t_{cf}$ the voltage value of the second filtered signal V2_SPK is almost equal to VCC/2. The speaker 22 receives on the first terminal T1 the first filtered signal V1_SPK having the trend P2SM, P3SM, P4SM and receives on the second terminal T2 the second filtered signal V2_SPK having the trend P2KSM, P3KSM.

The trend of the differential voltage signal V12_SPK (filtered ITU-R 468) at the ends of the speaker 22 comprises (see FIG. 2C) a first negative pulse having a first peak value $V_{p1}$, a second positive pulse having a second peak value $V_{p2}$ with a modulus higher than the first peak value $V_{p1}$ of the first pulse, a third negative pulse having a third peak value $V_{p3}$ with a modulus higher than the first peak value $V_{p2}$ of the second pulse, a fourth positive pulse having a fourth peak value $V_{p4}$ with a modulus lower than the first, the second, the third peak values $V_{p1}$, $V_{p2}$, $V_{p3}$ of the first, second and third pulses respectively.

It may be noticed that in the phase shift time interval of the switch-on operation mode the distance between the peak values $V_{p1}$, $V_{p2}$, $V_{p3}$, $V_{p4}$ is always lower than the value 4.7 $mV_{pp}$ and thus it is lower than the minimum audibility value generally set at 7.5 $mV_{pp}$: hence, the generation of the pop noise by the speaker 22 is highly reduced.

Further, starting at a certain instant, the value of the peaks of the differential voltage signal V12_SPK (filtered ITU-R 468) is decreasing towards the null value; in particular, at the instant $t_{cf}$ the value of the voltages of the first filtered signal V1_SPK and of the second filtered signal V2_SPK are about equal to VCC/2 and thus the value of the differential voltage signal V12_SPK (filtered ITU-R 468) at the instant $t_{cf}$ is substantially null, reducing (or eliminating) the spectral components within the audio band and highly reducing (or eliminating) the generation of the pop noise.

At the instant $t_{cf}$ the driver circuit 10 enters the normal operation mode, in particular in the counter-phase modulation time interval.

At the instant $t_{cf}$ the amplification system 1 receives the activation signal PWR_UP with a low logic value indicating the end of the switch-on operation mode and the beginning of the normal operation mode: the controller 56 receives on its first input terminal $I_{10}$ the low logic value of the activation signal PWR_UP and generates on the first output terminal $O_{10}$ the first selection signal $SEL_1$ having a value indicating the selection from the first input terminal $I_1$ of the multiplexer 54 and generates on the second output terminal $O_{11}$ the second selection signal $SEL_2$ having a value indicating the selection of the third input terminal $I_5$ of the multiplexer 55.

At the instant $t_{cf}$ the over-sampler 61 receives on its input terminal the input audio digital signal S_IN with a null value and generates on the output terminal an oversampled signal S61 with a null value. The interpolator 62 receives on its input terminal the oversampled signal S61 and generates on the two output terminals the first and the second sequences of samples S62 and S63 with null values. The noise shaper 63 receives on its two input terminals the first and the second sequences of samples S62 and S63 and generates on its two output terminals a third and a fourth sequence of samples S64 and S65 with null values. The pulse width modulator 64 receives on its first and second input terminals the third and the fourth sequence of samples S64 and S65 and generates on its first and second output terminals the first and the second pulse width modulated audio signals S3_PWM, S4_PWM phase shifted by 180° to each other, in particular:

the first pulse audio signal S3_PWM in the time interval comprised between $t_{cf}$ and $t_{15}$ is a square wave with a period $T_1=16*K$ and 50% duty-cycle, having positive pulses P5, P6 with a width $T_1/2=16*K/2=8*K$ between the instants $t_{12}$-$t_{13}$, $t_{14}$-$t_{15}$, respectively and with a null value between the instants $t_{cf}$-$t_{12}$, $t_{13}$-$t_{14}$;

the second pulse audio signal S4_PWM in the time interval comprised between $t_{cf}$ and $t_{15}$ is a square wave with a period $T_1=16*K$, with a 50% duty-cycle and phase shifted by 180° (i.e., in counter-phase) respect to the first pulse audio signal S3_PWM, i.e., the second pulse audio signal S4_PWM has positive pulses P5CF, P6CF with a width $T_1/2=16*K/2=8*K$ between instants $t_{cf}$-$t_{12}$, $t_{13}$-$t_{14}$ respectively and with a null value between instants $t_{12}$-$t_{13}$, $t_{14}$-$t_{15}$.

At the instants comprised between $t_{cf}$ and $t_{15}$ the first multiplexer 54 receives on the first input terminal $I_1$ the first pulse audio signal S3_PWM, receives on the selection input terminal $S_1$ the first selection signal $SEL_1$ having a value indicating the selection from the first input terminal $I_1$ and transmits on the output terminal $O_1$ the first square wave driving signal S1_PWM equal to the first pulse audio signal S3_PWM and thus having the positive pulses P5, P6 with a width 8*K between instants $t_{12}$-$t_{13}$, $t_{14}$-$t_{15}$ respectively and with a null value between instants $t_{cf}$-$t_{12}$, $t_{13}$-$t_{14}$, as shown in FIG. 2B.

Analogously, at the instants comprised between $t_{cf}$ and $t_{15}$ the second multiplexer 55 receives on the third input terminal $I_5$ the second pulse audio signal S4_PWM, receives on the selection input terminal $S_2$ the second selection signal $SEL_2$ having a value indicating the selection from the third input terminal $I_5$ and transmits on the output terminal $O_2$ the second square wave driving signal S2_PWM equal to the second pulse audio signal S4_PWM and thus having the positive pulses P5CF, P6CF with a width 8*K between instants $t_{cf}$-$t_{12}$, $t_{13}$-$t_{14}$ respectively and with a null value between instants $t_{12}$-$t_{13}$, $t_{14}$-$t_{15}$, as shown in FIG. 2B.

The values of the differential driving signal S12_PWM are calculated by means of the difference between the values of the first driving signal S1_PWM and the values of the second driving signal S2_PWM and thus at the instants comprised between $t_{cf}$ and $t_{15}$ the differential driving signal S12_PWM is a periodic square wave with a period $T_1=16*K$ and with alternating positive and negative pulses, i.e., with negative pulses −P5CF, −P6CF between the instants $t_{cf}$-$t_{12}$, $t_{13}$-$t_{14}$ and positive pulses P5, P6 between the instants $t_{12}$-$t_{13}$, $t_{14}$-$t_{15}$, as schematically shown in FIG. 2B.

At the instants comprised between $t_{cf}$ et $t_{15}$ the first driving stage 12 receives the first square wave driving signal S1_PWM having pulses P5, P6 and, as a function of them, generates the first internal square wave driving signal S1I_PWM having positive pulses P5I, P6I respectively with a width $T_1/2=16*K/2=8*K$ between instants $t_{12}$-$t_{13}$, $t_{14}$-$t_{15}$ respectively and with a null value between instants $t_{cf}$-$t_{12}$, $t_{13}$-$t_{14}$, wherein the pulses P5I, P6I are such to be able of driving the gate terminals of MOSFET 15 and 16.

Analogously, at the instants comprised between $t_{cf}$-$t_{15}$ the second driving stage 12 receives the second square wave driving signal S2_PWM having pulses P5CF, P6CF and, as a function of them, generates the second internal square wave driving signal S2I_PWM having positive pulses P5CFI, P6CFI respectively with width $T_1/2=16*K/2=8*K$ between instants $t_{cf}$-$t_{12}$, $t_{13}$-$t_{14}$ respectively and with a null value between instants $t_{12}$-$t_{13}$, $t_{14}$-$t_{15}$, wherein the pulses P5CFI, P6CFI are such to be able of driving the gate terminals of MOSFET 17 and 18.

The first half-bridge amplifier 35 receives on the input the first internal driving signal S1I_PWM and it provides therefrom at the output the first square wave amplified signal S1A_PWM having a positive pulse P5A and a positive pulse P6A having a width 8*K between the instants $t_{12}$-$t_{13}$ and $t_{14}$-$t_{15}$ respectively and with an amplitude greater than the amplitude of the pulse P5I and pulse P6I respectively of the first internal driving signal S1I_PWM and having a null value between the instants $t_{cf}$-$t_{12}$, $t_{13}$-$t_{14}$.

The second half-bridge amplifier 36 receives on the input the second internal driving signal S2I_PWM and it provides therefrom at the output the second square wave amplified signal S2A_PWM having a positive pulse P5CFA and a positive pulse P6CFA having a width 8*K between the instants $t_{cf}$-$t_{12}$ and $t_{13}$-$t_{14}$ respectively and with a amplitude greater than the amplitude of the pulse P5CFI and of the pulse P6CFI respectively of the second internal driving signal S2I_PWM and having a null value between the instants $t_{12}$-$t_{13}$, $t_{14}$-$t_{15}$.

The first low-pass filter 20 receives on the input terminal the first amplified signal S1A_PWM having the positive pulse P5A and the positive pulse P6A and it generates therefrom on its output terminal the first filtered signal V1_SPK having the voltage value about equal to VCC/2 at the instants comprised between $t_{cf}$ (excluded) and $t_{15}$.

The second low-pass filter 21 receives on the input terminal the second amplified signal S2A_PWM having the positive pulse P5CF and the positive pulse P6CF and it generates therefrom on its output terminal the second filtered signal V2_SPK having the voltage value about equal to VCC/2 at the instants comprised between $t_{cf}$ (excluded) and $t_{15}$.

The speaker 22 receives on the first terminal T1 the first filtered signal V1_SPK having the trend P5SM and receives on the second terminal T2 the second filtered signal V2_SPK having the trend P5CFSM.

The trend of the differential voltage signal V12_SPK (filtered ITU-R 468) at the terminals of the speaker 22 has a value at the instant $t_{cf}$ close to zero and the subsequent values are decreasing towards the value zero, as shown in FIG. 2C: thereby the spectral components within the audio band are reduced (or eliminated) and thus the generation of the pop noise is highly reduced (advantageously, eliminated) also at the starting instants (comprised between $t_{cf}$ and $t_{15}$) of the normal operation mode.

It is to be noticed that for the purpose of the disclosure it is not essential to generate the first driving signal S1_PWM and the second driving signal S1_PWM phase aligned each other with a 50% duty-cycle in the time interval comprised between $t_0$ and $t_{sf}$.

For example, according to a variant of the first embodiment, the phase modulation time interval may also not be present, i.e., the switch-on operation modulation may also include only the phase shift time interval; in this variant it's possible to achieve the same noise reduction as the first embodiment starting from instant $t_{sf}$ with the voltages of the first filtered signal V1_SPK and of the second filtered signal V2_SPK equal to value VCC/2 (for example, the first and the second low-pass filters 20, 21 comprise two respective capacitors connected between the terminals T1, T2 of the speaker 22 and ground respectively and such capacitors are kept charged at the voltage VCC/2).

Alternatively, according to another variant of the first embodiment of the disclosure a time interval is present before the instant $t_{sf}$ (for example comprised between $t_0$ and $t_{sf}$) wherein the switching amplifier 11 is switched on and is kept in the high-impedance state and in said time interval a dedicated circuit performs the loading of the voltages of the first filtered signal V1_SPK and of the second filtered signal V2_SPK at the value VCC/2.

Figure 4:
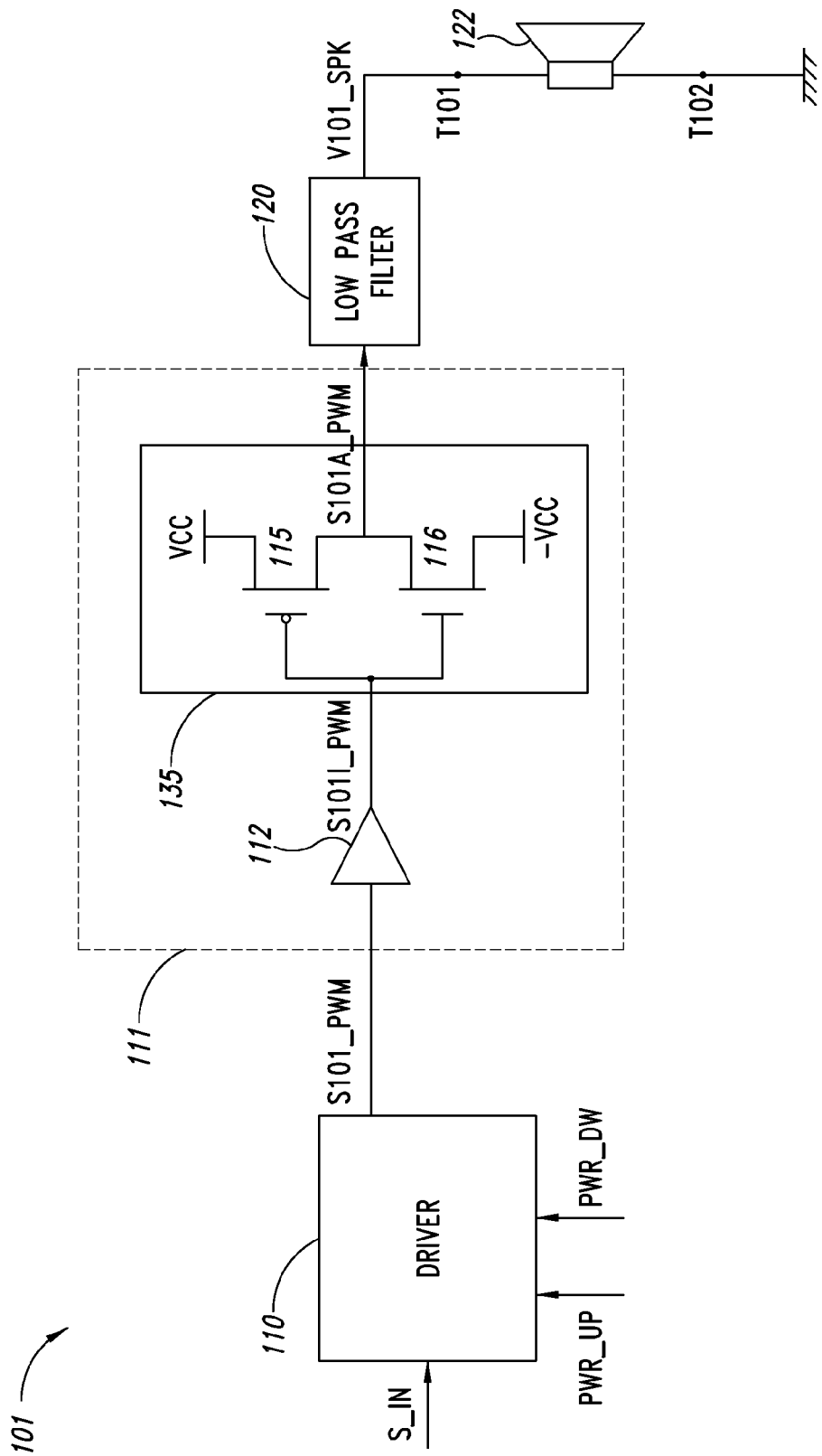
FIG. 4 schematically shows an amplification system according to a second embodiment of the disclosure.

With reference to FIG. 4, it is shown an amplification system 101 according to the second embodiment of the disclosure.

The amplification system 101 comprises the driver circuit 110, a switching amplifier 111, a low-pass filter 120 and a speaker 122.

The driver circuit 110 has an operation similar to the driver circuit 10 of the first embodiment of the disclosure, with the difference that the driver circuit 110 comprises an output terminal for generating a pulse driving signal S101_PWM (preferably, with width modulation) for driving the switching amplifier 111.

In particular, the switch-on operation mode does not comprise the phase modulation time interval and comprises the phase-shift time interval wherein the trend of the driving signal S101_PWM is similar to the phase-shift time interval, i.e., the driving signal S101_PWM carries pulses with width increasing between subsequent pulses according to a step value having modulus equal to two and odd values and furthermore with a polarity alternating between subsequent pulses, with the difference that no null values are present between subsequent pulses. In other words, the length of subsequent pulses of the driving signal S101_PWM in the switch-on operation mode has the following values:

K', with a positive polarity;
3*K, with a negative polarity;
5*K, with a positive polarity;
7*K, with a negative polarity;
. . .

wherein K' is an appropriate value.

Preferably, the driving signal S101_PWM in the switch-on operation mode is periodic with a period $T_1$' and the value K' is a fraction of said period $T_1$'. Advantageously, the relationship between K' and $T_1$' is the following: K'=$T_1$'/(8*n'), wherein n' is an integer number (i.e., n'=1, 2, 3, . . . ).

The switching amplifier 111 is of the half-bridge type, with dual power supply VCC and −VCC and it is implemented with a controlled switch 115 (for example, a n-channel MOSFET 115) and a controlled switch 116 (for example, a p-channel MOSFET 116) and comprises:

an input terminal for receiving the pulse width modulated driving signal S101_PWM;
an output terminal for generating an amplified signal S101A_PWM with pulse width modulation obtained by means of an amplification of the pulse width modulated driving signal S101_PWM.

The low-pass filter 120 comprises an input terminal for receiving the amplified signal S101A_PWM and comprises an output terminal for generating a filtered signal V101_SPK obtained by means of a low-pass filtering (in particular, in the audio band) of the amplified signal S101A_PWM.

The speaker 122 comprises a first terminal T101 connected to the output terminal of the low-pass filter 120 and comprises a second terminal T102 connected to ground.

The operation of the amplification system 101 of the second embodiment of the disclosure is similar to that of the amplification system 1 of the first embodiment of the disclosure.

According to a variant of the first and second embodiments, the first driving stage 12 is implemented with two driving circuits, each of them driving the control terminal of the switch 15 (in the example, the gate terminal of MOSFET 15) and of the switch 16 (in the example, the gate terminal of MOSFET 16) respectively. This allows to use switches 15 and 16 which are different from each other, because it is possible to generate different voltage values for driving the control terminals of the switch 15 and of the switch 16. Analogously, the second driving stage 13 may be implemented with two further driving circuits, each one driving the control terminal of the switch 17 (in the example, the gate terminal of the MOSFET 17) and of the switch 18 (in the example, the gate terminal of the MOSFET 18) respectively.

One embodiment of the present disclosure also is a method for driving a switching amplifier. The method comprises the steps of:

a) providing the switching amplifier configured to receive a driving signal;

b) generating, in a switch-on operation mode, the driving signal for driving the switching amplifier, the driving signal carrying a plurality of pulses;

c) increasing the pulse width between contiguous pulses of the plurality of pulses according to a step value having modulus equal to two and odd values; and d) alternating the polarity between the contiguous pulses.

Preferably, step b) of the method further comprises generating, in the switch-on operation mode, the plurality of pulses that are a substantially square waveform according to a period $T_1$, wherein the width K of a first pulse out of the plurality of pulses is equal to $T_1/(8*n)$, wherein n is an integer value greater than or equal to one.

One embodiment of the present disclosure is a method for driving the switching amplifier 11. The method comprises the steps of:

a) providing the switching amplifier configured to receive a driving signal;

b) generating, in a switch-off operation mode, the driving signal for driving the switching amplifier, the driving signal carrying a plurality of pulses;

c) decreasing the pulse width between contiguous pulses of the plurality of pulses according to a step value having modulus equal to two and odd values; and d) alternating the polarity between the contiguous pulses.

Preferably, step b) of the method for driving the switching amplifier 11 further comprises generating, in the switch-on operation mode, the plurality of pulses that are substantially square waveform according to a period $T_1$, wherein the width K of the last pulse out of the plurality of pulses is equal to $T_1/(8*n)$, wherein n is an integer value greater than or equal to one.

Preferably, the length of steps b), c), d) of the method for driving the switching amplifier 11 is equal to $(T_1/2)*[T_1/(4*K)+1]$.

In case the generation of the driving signals S1_PWM, S2_PWM, S12_PWM, S101_PWM is completely digital, the steps b), c), d) of the method for driving the switching amplifier 11 can be carried out by means of a computer program comprising a software code and run on a controller that may be a specific or programmable circuit (for example, a FPGA=Field Programmable Gate Array), or the software code may be run on a microprocessor. The programming language used of the software program code may be (in case of an implementation with a specific or programmable circuit) for example VHDL or Verilog and (in case of an implementation with a micro-processor) it may be the C language.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic circuit for driving a switching amplifier, the circuit comprising:

a pulse generator configured to generate, when operating in a switching mode, a driving signal for driving the switching amplifier, the driving signal carrying a plurality of pulses having:

pulse widths changing between contiguous pulses of the plurality of pulses according to a step value having modulus equal to two and odd values; and polarities alternating between the contiguous pulses.

2. An electronic circuit according to claim 1, wherein the plurality of pulses comprise a substantially square waveform according to a period $T_1$, and the width K of a first pulse out of the plurality of pulses is equal to $T_1/(8*n)$, wherein n is an integer value greater or equal than one.

3. An electronic circuit according to claim 2, wherein the switching mode has a duration equal to $(T_1/2)*[T_1/(4*K)+1]$.

4. An electronic circuit according to claim 2, wherein the pulse generator is configured to:

generate the driving signal as a difference between a first driving signal and a second driving signal, the first driving signal having a first square waveform having a period substantially equal to $T_1$ and a pulse width substantially equal to $T_1/2$, and the second driving signal having a second square waveform having, at a beginning of the switching mode, a phase shift with respect to the first square waveform equal to K, having a period substantially equal to $T_1+4*K$ and having a pulse width substantially equal to $(T_1+4*K)/2$.

5. An electronic circuit according to claim 4, wherein the pulse generator includes:

a first generator configured to generate a first clock signal having period equal to $T_1$;

a second generator configured to receive a reset signal and generate a second clock signal having period equal to $T_1+4*K$;

a delay block configured to generate a phase shifted clock signal by delaying the second clock signal by a value equal to K;

a first multiplexer configured to receive the first clock signal and a first pulse width modulated signal and select, as the first driving signal, one of the first clock signal and the first pulse width modulated signal as a function of a first selection signal;

a second multiplexer configured to receive the first clock signal, the phase-shifted clock signal, and a second pulse width modulated signal and select, as the second driving signal, one of the first clock signal, the phase-shifted clock signal and the second pulse width modulated signal as a function of a second selection signal;

a controller configured to receive an activation signal and generate therefrom the first selection signal, the second selection signal, and the reset signal.

6. An electronic circuit according to claim 1, wherein the pulse generator is configured to decrease the pulse width by the step values.

7. An electronic circuit according to claim 1, wherein the pulse generator is configured to increase the pulse width by the step values.

8. A system including:
a switching amplifier configured to generate an amplified signal from a driving signal; and
a driver circuit coupled to the switching amplifier and including:
an input terminal arranged to receive an input signal; and
a pulse generator configured to generate, when operating in a switching mode, the driving signal carrying a plurality of pulses having:
pulse widths changing between contiguous pulses of the plurality of pulses according to a step value having modulus equal to two and odd values; and
polarities alternating between the contiguous pulses.

9. A system according to claim 8, further including:
a low-pass filter configured to receive the amplified signal and generate therefrom a filtered signal in an audio bandwidth; and
a speaker configured to receive the filtered signal and generate therefrom an audio signal.

10. A system according to claim 8, wherein the pulse generator is configured to:
generate the driving signal as a difference between a first driving signal and a second driving signal, the first driving signal having a first square waveform having a period substantially equal to $T_1$ and a pulse width substantially equal to $T_1/2$, and the second driving signal having a second square waveform having, at a beginning of the switch-on mode, a phase shift with respect to the first square waveform equal to K, having a period substantially equal to $T_1+4*K$, and having a pulse width substantially equal to $(T_1+4*K)/2$, wherein K is a pulse width of a first pulse out of the plurality of pulses.

11. A system according to claim 8, wherein the pulse generator includes:
a first generator configured to generate a first clock signal having period equal to $T_1$;
a second generator configured to receive a reset signal and generate a second clock signal having period equal to $T_1+4*K$, wherein K is a pulse width of a first pulse out of the plurality of pulses;
a delay block configured to generate a phase shifted clock signal by delaying the second clock signal by a value equal to K;
a first multiplexer configured to receive the first clock signal and a first pulse width modulated signal and select, as the first driving signal, one of the first clock signal and the first pulse width modulated signal as a function of a first selection signal;
a second multiplexer configured to receive the first clock signal, the phase-shifted clock signal, and a second pulse width modulated signal and select, as the second driving signal, one of the first clock signal, the phase-shifted clock signal and the second pulse width modulated signal as a function of a second selection signal; and a controller configured to receive an activation signal and generate therefrom the first selection signal, the second selection signal, and the reset signal.

12. A system according to claim 11, wherein:
the driver circuit comprises a pulse width modulator configured to generate, when the driver circuit is operating in a normal mode, the first and second pulse width modulated signals as a function of the input signal, and
the switching amplifier has a full-bridge topology including first and second half-bridges configured to be controlled by the first and the second driving signals respectively.

13. A system according to claim 8, wherein:
the driver circuit comprises a pulse width modulator configured to generate, when the driver circuit is operating in a normal mode, a pulse width modulated signal as a function of the input signal, and
the switching amplifier has a dual supply half-bridge topology configured to be controlled by the driving signal.

14. A system according to claim 8, wherein the pulse generator is configured to increase the pulse width by the step values.

15. A system according to claim 8, wherein the pulse generator is configured to decrease the pulse width by the step values.

16. A system according to claim 8, wherein the plurality of pulses comprise a substantially square waveform according to a period $T_1$, and the width K of a first pulse out of the plurality of pulses is equal to $T_1/(8*n)$, wherein n is an integer value greater or equal than one.

17. A system according to claim 16, wherein the switching mode has a duration equal to $(T_1/2)*[T_1/(4*K)+1]$.

18. A method, comprising:
driving a switching amplifier with a driving signal that includes a plurality of pulses;
generating a first pulse of the plurality of pulses, the first pulse having a first pulse width
generating subsequent pulses of the plurality of pulses, the subsequent pulses having pulse widths that are varied with respect to the first pulse by step values having modulus equal to two and odd values, wherein contiguous pulses of the first and subsequent pulses of the plurality of pulses have alternating polarities with respect to one another.

19. A method according to claim 18, wherein generating the subsequent pulses includes, when the switching operation mode is a switch-off operation mode, decreasing the pulse widths of the subsequent pulses with respect to the first pulse according to the step value.

20. A method according to claim 18, wherein generating the subsequent pulses includes, when the switching operation mode is a switch-on operation mode, increasing the pulse widths of the subsequent pulses with respect to the first pulse according to the step value.

21. A method according to claim 18, wherein the plurality of pulses comprise a substantially square waveform according to a period $T_1$, and a width K of the first pulse is equal to $T_1/(8*n)$, wherein n is an integer value greater or equal than one.

22. A method according to claim 18, comprising generating the driving signal as a difference between a first driving signal and a second driving signal, wherein generating the driving signal includes:

generating the first driving signal having a first square waveform having a period substantially equal to $T_1$ and a pulse width substantially equal to $T_1/2$; and generating the second driving signal having a second square waveform having, at a beginning of the switching mode, a phase shift with respect to the first square waveform equal to K, having a period substantially equal to $T_1+4*K$ and having a pulse width substantially equal to $(T_1+4*K)/2$, wherein K is a pulse width of the first pulse.

* * * * *